(12) United States Patent
Sperl et al.

(10) Patent No.: US 10,396,259 B2
(45) Date of Patent: Aug. 27, 2019

(54) RADIATION-EMITTING SEMICONDUCTOR COMPONENT AND PRODUCTION METHOD OF A PLURALITY OF SEMICONDUCTOR COMPONENTS

(71) Applicant: OSRAM Opto Semiconductors GmbH, Regensburg (DE)

(72) Inventors: Matthias Sperl, Mintraching (DE); Frank Singer, Regenstauf (DE); Jürgen Moosburger, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1 day.

(21) Appl. No.: 15/565,112

(22) PCT Filed: Apr. 5, 2016

(86) PCT No.: PCT/EP2016/057408
§ 371 (c)(1),
(2) Date: Oct. 6, 2017

(87) PCT Pub. No.: WO2016/165977
PCT Pub. Date: Oct. 20, 2016

(65) Prior Publication Data
US 2018/0123007 A1 May 3, 2018

(30) Foreign Application Priority Data
Apr. 14, 2015 (DE) .................... 10 2015 105 692

(51) Int. Cl.
*H01L 33/62* (2010.01)
*H01L 33/64* (2010.01)

(52) U.S. Cl.
CPC .............. *H01L 33/62* (2013.01); *H01L 33/64* (2013.01); *H01L 33/647* (2013.01); *H01L 33/642* (2013.01); *H01L 2933/0075* (2013.01)

(58) Field of Classification Search
None
See application file for complete search history.

(56) References Cited

U.S. PATENT DOCUMENTS

| 9,691,682 | B2 * | 6/2017 | Sabathil | .................. H01L 33/62 |
| 2002/0089047 | A1 | 7/2002 | Arndt | |

(Continued)

FOREIGN PATENT DOCUMENTS

| DE | 29825022 U1 | 4/2004 |
| DE | 102008045653 A1 | 3/2010 |

(Continued)

*Primary Examiner* — Herve-Louis Y Assouman
(74) *Attorney, Agent, or Firm* — Slater Matsil, LLP

(57) ABSTRACT

A radiation-emitting semiconductor component and a method for producing a plurality of semiconductor components are disclosed. In an embodiment the component includes a semiconductor chip comprising a semiconductor layer sequence, a front side and a rear side opposite the front side, and a molded body molded on to the semiconductor chip at least in some places. The component further includes a thermal connector located on a rear side of the semiconductor component, wherein the rear side of the semiconductor component is opposite the front side of the semiconductor chip, wherein the thermal connector extends to the rear side of the semiconductor chip, wherein at least one electrical connection surface is located on the front side of the semiconductor chip, and wherein the at least one electrical connection surface is electrically-conductively connected to an electrical contact surface of the semiconductor component via a contact path running on the molded body.

14 Claims, 7 Drawing Sheets

(56) References Cited

U.S. PATENT DOCUMENTS

| | | | |
|---|---|---|---|
| 2010/0025722 A1* | 2/2010 | Wada | H01L 33/486 |
| | | | 257/99 |
| 2010/0320585 A1* | 12/2010 | Jiang | H01L 21/561 |
| | | | 257/686 |
| 2011/0140284 A1 | 6/2011 | Gunther et al. | |
| 2011/0211334 A1* | 9/2011 | Kim | H01L 33/54 |
| | | | 362/84 |
| 2012/0112337 A1 | 5/2012 | Groetsch et al. | |
| 2012/0126280 A1* | 5/2012 | Lee | H01L 33/642 |
| | | | 257/99 |
| 2013/0009190 A1 | 1/2013 | Memida | |
| 2013/0026589 A1* | 1/2013 | Wu | H01L 27/14618 |
| | | | 257/432 |
| 2013/0214418 A1* | 8/2013 | Yang | H01L 24/24 |
| | | | 257/762 |
| 2015/0014737 A1 | 1/2015 | Illek et al. | |
| 2015/0235919 A1 | 8/2015 | Sabathil et al. | |
| 2016/0056344 A1 | 2/2016 | Reill et al. | |

FOREIGN PATENT DOCUMENTS

| | | | |
|---|---|---|---|
| DE | 102008045925 A1 | 3/2010 | |
| DE | 102012002605 A1 | 8/2013 | |
| DE | 102012212968 A1 | 1/2014 | |
| DE | 102013103226 A1 | 10/2014 | |
| WO | 2014016165 A1 | 1/2014 | |
| WO | WO 2014016165 * | 1/2014 | H01L 33/54 |

\* cited by examiner

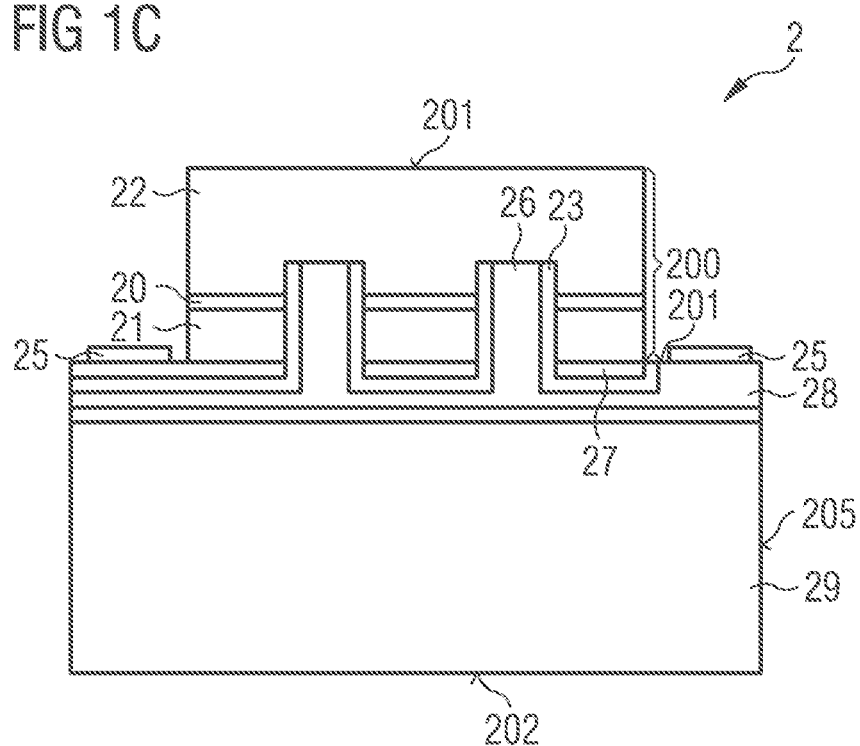
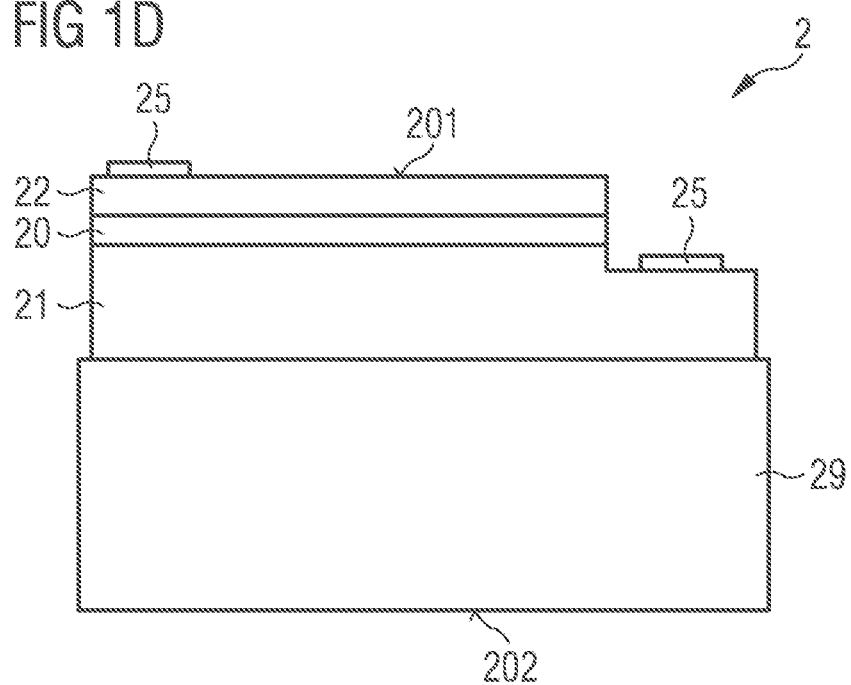

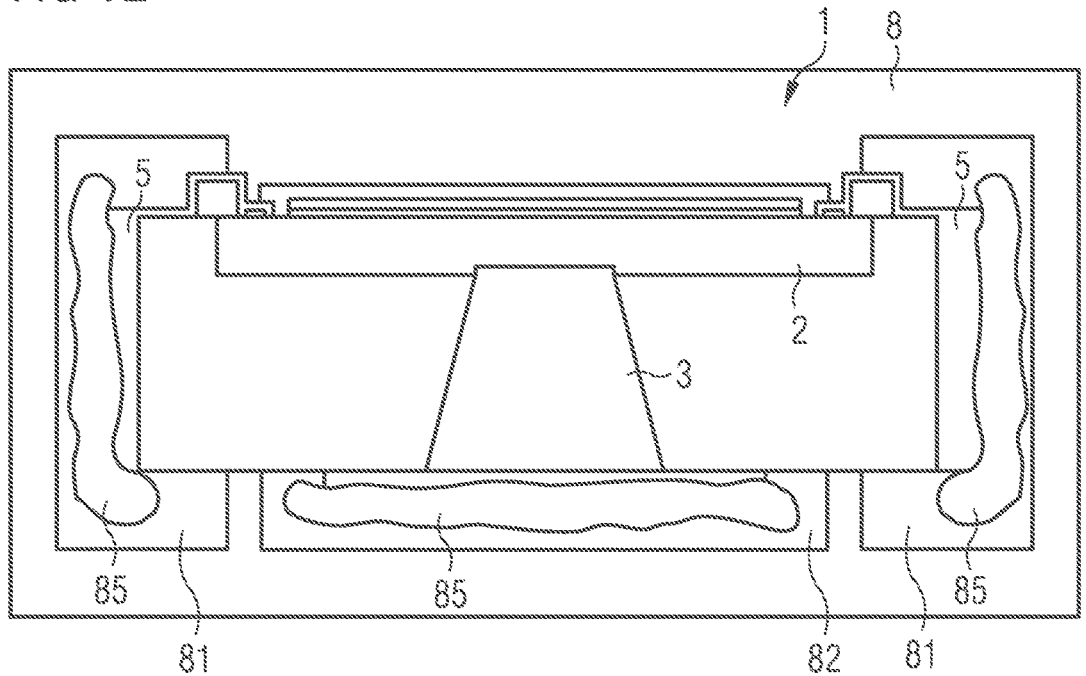
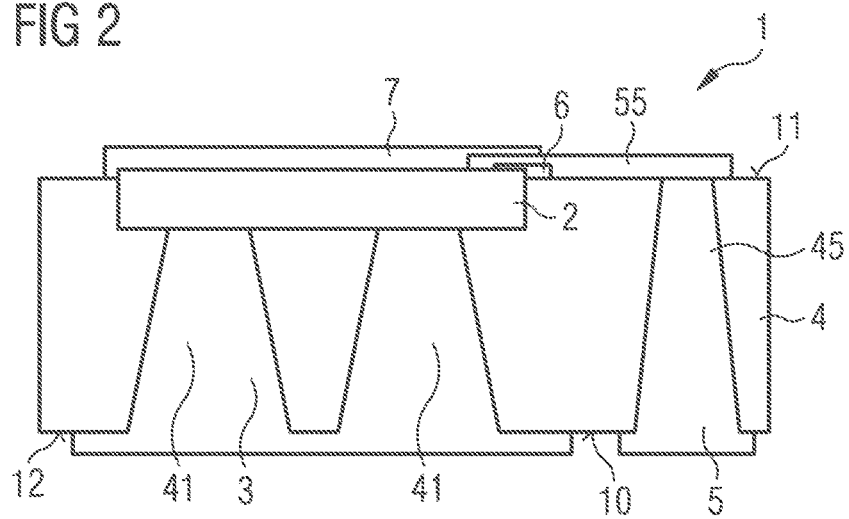

RADIATION-EMITTING SEMICONDUCTOR COMPONENT AND PRODUCTION METHOD OF A PLURALITY OF SEMICONDUCTOR COMPONENTS

This patent application is a national phase filing under section 371 of PCT/EP2016/057408, filed Apr. 5, 2016, which claims the priority of German patent application 10 2015 105 692.5, filed Apr. 14, 2015, each of which is incorporated herein by reference in its entirety.

TECHNICAL FIELD

The present application relates to an optoelectronic semiconductor component and a method for the production of a plurality of optoelectronic semiconductor components.

BACKGROUND

For the production of particularly compact semiconductor components, e.g., light-emitting diodes, the semiconductor chips intended for generating radiation can be completely embedded in plastic, with the exception of their emission side (front side). However, typically used plastics materials have low thermal conductivity, often of <1 W/mK, and therefore effective heat dissipation from the semiconductor chip during operation is severely impaired. Heat dissipation via electrically connected metallic surfaces is also possible only to an insufficient extent owing to their low thickness.

SUMMARY OF THE INVENTION

Embodiments provide a semiconductor component which can be produced simply and inexpensively and which, in addition, provides good heat dissipation of the waste heat formed during operation of the semiconductor component. Furthermore, embodiments provide a method for producing semiconductor components simply and reliably.

An optoelectronic semiconductor component is provided.

According to at least one embodiment of the optoelectronic semiconductor component, the semiconductor component comprises a semiconductor chip. The semiconductor chip comprises an active region provided for generating radiation. For example, the active region is part of a semiconductor layer sequence, in particular an epitaxial semiconductor layer sequence. The active region is intended in particular to generate radiation in the visible, ultraviolet or infrared range of the spectrum. The semiconductor layer sequence comprises, e.g., a first semiconductor layer of a first conduction type and a second semiconductor layer of a second conduction type, which is different from the first conduction type. The active region is arranged between the first semiconductor layer and the second semiconductor layer. For the electrical contacting of the semiconductor chip, the semiconductor chip expediently comprises a first connection surface and a second connection surface. For example, the first connection surface is provided for the electrical contacting of the first semiconductor layer and the second connection surface for the electrical contacting of the second semiconductor layer.

The semiconductor chip has a front side. The side at which radiation generated in the active region is emitted during operation of the semiconductor chip is considered to be the front side. The front side in particular runs parallel to a main extension plane of the active region, at least in places. Furthermore, the semiconductor chip has a rear side opposite the front side. Side surfaces of the semiconductor chip, which connect the front side to the rear side, run obliquely or perpendicularly to the active region.

According to at least one embodiment of the optoelectronic semiconductor component, the semiconductor component comprises a molded body, which is molded on to the semiconductor chip at least in some places. In particular, the semiconductor chip is molded on to at least two side surfaces or to all side surfaces of the semiconductor chip. At the locations at which the molded body is molded on to the semiconductor chip, the molded body in particular borders the semiconductor chip directly. In particular, the molded body forms a housing body for the semiconductor chip.

The molded body is in particular opaque, e.g., reflective, for the radiation generated in the semiconductor chip. For example, the molded body has a reflectance of at least 60%, preferably at least 80%, for the radiation generated in the semiconductor chip.

The front side of the semiconductor chip is expediently free from the material of the molded body, at least in some places, so that the radiation generated during operation of the semiconductor chip can emerge from the semiconductor chip unimpeded at the front side, even in the case of a radiopaque molded body.

In a vertical direction, i.e., perpendicular to a main extension plane of the active region, the molded body can have a greater extension than the semiconductor chip along this direction. Furthermore, at least in some places, the molded body can form two outer surfaces or more, in particular all outer surfaces, of the optoelectronic semiconductor component. The side surfaces, the front side and the rear side of the semiconductor component are regarded as outer surfaces, the front side and the rear side in particular each running parallel to the main extension plane of the active region of the semiconductor chip, and the radiation emerging at the front side during operation of the semiconductor component.

According to at least one embodiment of the optoelectronic semiconductor component, the semiconductor component has a thermal connector on a rear side of the semiconductor component opposite the front side of the semiconductor chip. The thermal connector extends in particular to the rear side of the semiconductor chip. The thermal connector can also project into the semiconductor chip. The thermal connector in particular comprises a material having a high thermal conductivity, e.g., a thermal conductivity of at least 100 W/mK, preferably at least 200 W/mK.

In contrast to an electrical contact, the thermal connector is not, or at least is not only, provided for the electrical contacting of the semiconductor chip. In particular, the thermal connector can also be electrically insulated from the active region of the semiconductor chip.

According to at least one embodiment of the optoelectronic semiconductor component, the semiconductor chip has at least one electrical connection surface on the front side. The electrical connection surface is provided for the electrical contacting of the semiconductor chip. In particular, the connection surface is electrically-conductively connected to an electrical contact surface of the semiconductor component via a contact path running on the molded body. The electrical contact surface is provided for the external electrical contacting of the semiconductor component and is accessible on an outer surface of the semiconductor component. The front side of the semiconductor chip can also have more than one electrical connection surface, e.g., two electrical connection surfaces and in particular precisely two electrical connection surfaces. By means of the contact path, for example, a planar electrical contact is formed, i.e., a contact without a wire bond connection.

The rear side of the semiconductor chip can be free from an electrical connection surface. However, it is also conceivable that the rear side of the semiconductor chip has an electrical connection surface. This electrical connection surface can be connected to the thermal connector or can be arranged at a distance from the thermal connector, spatially.

In at least one embodiment of the optoelectronic semiconductor component, the optoelectronic semiconductor component comprises a semiconductor chip, which comprises a semiconductor layer sequence having an active region provided for generating radiation. The semiconductor chip has a front side and a rear side opposite the front side. The semiconductor component comprises a molded body, which is molded on to the semiconductor chip at least in some places. The semiconductor component has a thermal connector on a rear side of the semiconductor component opposite the front side of the semiconductor chip, which extends to the rear side of the semiconductor chip. On the front side, the semiconductor chip has at least one electrical connection surface, which is electrically-conductively connected to an electrical contact surface of the semiconductor component via a contact path running on the molded body.

Waste heat generated in the semiconductor chip during operation of the semiconductor component can be dissipated efficiently via the thermal connector. As a result, the temperature of the active region decreases during operation and, therefore, the efficiency of the semiconductor chip is improved. Furthermore, the service life of the semiconductor component is improved owing to the reduced temperatures. In addition, the thermal connector provides an additional connection surface for fixing to a connection carrier, e.g., a circuit board, such that the semiconductor component fixed on the connection carrier can better be mechanically anchored thereon. For example, the fixing on the connection carrier takes place by means of a soldered joint. Furthermore, the waste heat obtained during operation does not have to be dissipated via the molded body. The vertical extension of the molded body can thus be increased to improve the mechanical stability without a deterioration in heat dissipation resulting therefrom.

According to at least one embodiment of the optoelectronic semiconductor component, the molded body is molded on to the rear side of the semiconductor chip in some places and the molded body has a recess through which the thermal connector extends to the rear side of the semiconductor chip. Owing to the fact that the molded body borders the rear side of the semiconductor chip, the anchoring of the semiconductor chip in the molded body is improved.

According to at least one embodiment of the optoelectronic semiconductor component, a surface area of the thermal connector on the rear side of the semiconductor component is at least 60% of a surface area of the rear side of the semiconductor chip. The thermal connector therefore offers a comparatively large connection surface, via which the heat can be dissipated into the connection carrier. The surface area of the thermal connector can also be greater than or equal to the surface area of the rear side of the semiconductor chip.

According to at least one embodiment of the optoelectronic semiconductor component, the semiconductor chip has two electrical connection surfaces on the front side, which are each connected to an electrical contact surface of the semiconductor component via a contact path. In particular, the electrical contacting of the semiconductor chip can take place exclusively from the front side of the semiconductor chip.

According to at least one embodiment of the optoelectronic semiconductor component, the thermal connector is at a distance from the electrical contact surfaces. For example, in a top view of the front side of the semiconductor chip, the thermal connector is arranged between two electrical contact surfaces.

In particular, in a top view of the front side of the semiconductor chip, the thermal connector overlaps the semiconductor chip. For example, a centroid of the thermal connector overlaps the semiconductor chip in a top view of the front side of the semiconductor chip. The loss heat forming in the semiconductor chip during operation can be efficiently dissipated from the semiconductor chip via the thermal connector.

Furthermore, the electrical contact surfaces are arranged at the side of the semiconductor chip, at least in some places. In a top view of the front side of the semiconductor chip, the electrical contact surfaces therefore project beyond the semiconductor chip, at least in some places. The electrical contact surfaces can also be arranged completely at the side of the semiconductor chip, i.e., having no overlap with the semiconductor chip in a top view of the front side. In particular, it is not the primary purpose of the electrical contact surfaces to dissipate heat and so their position relative to the semiconductor chip can be selected in view of the simplified electrical contacting of the semiconductor component.

According to at least one embodiment of the optoelectronic semiconductor component, the molded body borders at least two side surfaces of the semiconductor chip. The front side of the semiconductor chip is, at least in some areas or completely, free from the material of the molded body. The molded body can in particular border all side surfaces of the semiconductor chip. In this way, radiation generated in the semiconductor chip during operation of the semiconductor component can be prevented from emerging through the side surfaces of the semiconductor chip.

According to at least one embodiment of the optoelectronic semiconductor component, an outer surface of the thermal connector comprises a solderable material. In other words, the thermal connector can be contacted to a connection carrier, thermally and optionally also electrically, by means of a soldered joint.

For example, the outer surface of the thermal connector can comprise tin or gold, for instance in the form of a coating of the thermal connector forming the outer surface of the thermal connector.

According to at least one embodiment of the optoelectronic semiconductor component, the contact path is guided over an interface between the molded body and the semiconductor chip, the contact path being at a distance from the interface in a direction running perpendicular to the front side. In particular, an electrically insulating material can be arranged between the interface and the contact path.

According to at least one embodiment of the optoelectronic semiconductor component, a side surface of the semiconductor component running obliquely or perpendicularly to the active region forms a mounting surface. During mounting of the semiconductor component in such a way that the mounting surface faces towards the connection carrier, a main radiation direction of the semiconductor component can run parallel to the connection carrier. A semiconductor component of this type with a lateral emission direction is also known as a "sidelooker". For example, the semiconductor component is intended for lateral coupling into a light guide, for instance for backlighting a liquid crystal display (LCD).

According to at least one embodiment of the semiconductor component, the rear side of the semiconductor component forms a mounting surface of the semiconductor component. In particular, the semiconductor component can be electrically connected at the rear side. For example, all the electrical contact surfaces required for the electrical contacting of the semiconductor component are accessible at the rear side of the semiconductor component. During mounting of the semiconductor component on the connection carrier in such a way that the rear side faces towards the connection carrier, the main radiation direction of the radiation generated during operation runs perpendicularly to the connection carrier. A semiconductor component of this type, which radiates upwards when viewed from the connection carrier, is also known as a "toplooker". For example, the semiconductor component is provided for general lighting or in a headlamp, e.g., for a motor vehicle.

Furthermore, a method for producing a plurality of semiconductor components is provided.

According to at least one embodiment of the method, a plurality of semiconductor chips are provided, each comprising an active region provided for generating radiation and a front side. For example, the semiconductor chips are arranged on an auxiliary carrier in a matrix shape.

According to at least one embodiment of the method, the method comprises a step in which the semiconductor chips are overmolded with a molding compound, at least in some regions, to form a molded body composite, the molded body composite covering the rear sides opposite the front sides of the semiconductor chips in each case. For example, the molding compound is applied by means of a molding method. A molding method is generally understood to be a method by which a molding compound can be formed according to a predefined shape and cured if necessary. In particular, the term "molding method" comprises molding, film assisted molding, injection molding, transfer molding and compression molding.

According to at least one embodiment of the method, the method comprises a step in which the rear sides of the semiconductor chips are exposed in some regions. In particular, when exposing the rear sides, material from the semiconductor chips may also be removed in some places. In this way, it can be ensured in a simple manner that no residue of the molding compound is found between the subsequently applied thermal connector and the rear side of the semiconductor chip.

According to at least one embodiment of the method, the method comprises a step in which a plurality of thermal connectors are formed, wherein the thermal connectors each border the rear sides of the semiconductor chips.

The thermal connectors are formed in particular after overmolding the semiconductor chips with the molding compound. The thermal connectors are therefore not part of a pre-fabricated carrier on which the semiconductor chips are fixed. An interconnecting layer between the thermal connectors and the semiconductor chips, e.g., a solder layer or a thermally conductive adhesive layer, is therefore unnecessary.

The formation of the thermal connectors can also take place in a multi-stage method, e.g., by depositing a thin seeding layer and a subsequent reinforcement, for instance by electrodeposition. In particular, the recesses in the molded body composite which are formed upon exposing the rear sides of the semiconductor chips can be partly or completely filled with the material for the thermal connectors.

According to at least one embodiment of the method, the method comprises a step in which the molded body composite is singulated into a plurality of semiconductor components, wherein the semiconductor components each comprise a semiconductor chip and a thermal connector.

In at least one embodiment of the method, a plurality of semiconductor chips are provided, each of which has an active region provided for generating radiation and a front side. The semiconductor chips are overmolded in some regions with a molding compound to form a molded body composite, the molded body composite in each case covering the rear sides opposite the front sides. The rear sides of the semiconductor chips are exposed in some regions. A plurality of thermal connectors are formed, the thermal connectors bordering the rear sides of the semiconductor chips. The molded body composite is singulated into a plurality of semiconductor components, which each comprise a semiconductor chip and a thermal connector. The method is preferably carried out in the order listed above. However, it is also possible that the molded body composite is already in a form such that the rear sides of the semiconductor chip are exposed in some regions. The step of exposing the rear sides of the semiconductor chips in some regions and of overmolding the semiconductor chips in some regions can therefore take place in a joint production step.

According to at least one embodiment of the method, before the singulation of the molded body composite, a coating is applied on the molded body composite for the electrical contacting of the semiconductor chips. When the coating is applied, the molded body composite can comprise cut-outs, the side surfaces of which are coated when the coating is applied.

The method described is particularly suitable for the production of the semiconductor component described above. Features mentioned in conjunction with the method can therefore also be referred to for the semiconductor component and vice versa.

BRIEF DESCRIPTION OF THE DRAWINGS

Further versions and expediencies can be taken from the following description of the exemplary embodiments in conjunction with the figures.

The Figures show in:

FIGS. 1C and 1D are exemplary embodiments of a semiconductor chip which is suitable for the optoelectronic semiconductor component;

FIG. 1E is an exemplary embodiment for a device with a semiconductor component on a connection carrier;

FIG. 2 is an exemplary embodiment of an optoelectronic semiconductor component in a schematic sectional view.

Identical, like elements or similar elements are provided with the same reference characters in the figures.

The figures are in each case schematic diagrams and therefore not necessarily to scale. Rather, the size of comparatively small elements, and in particular layer thicknesses, may be exaggerated for the purpose of better understanding.

DETAILED DESCRIPTION OF ILLUSTRATIVE EMBODIMENTS

Figure 1A:
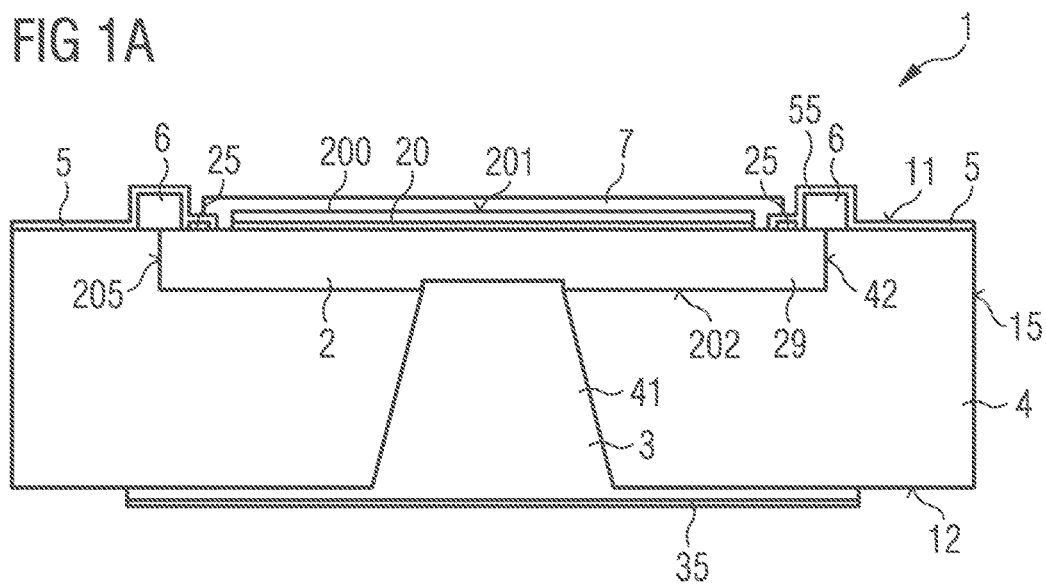
FIGS. 1A and 1B are exemplary embodiments of an optoelectronic semiconductor component in a schematic sectional view (FIG. 1A) and a perspective sectional illustration (FIG. 1B)
Figure 1B:
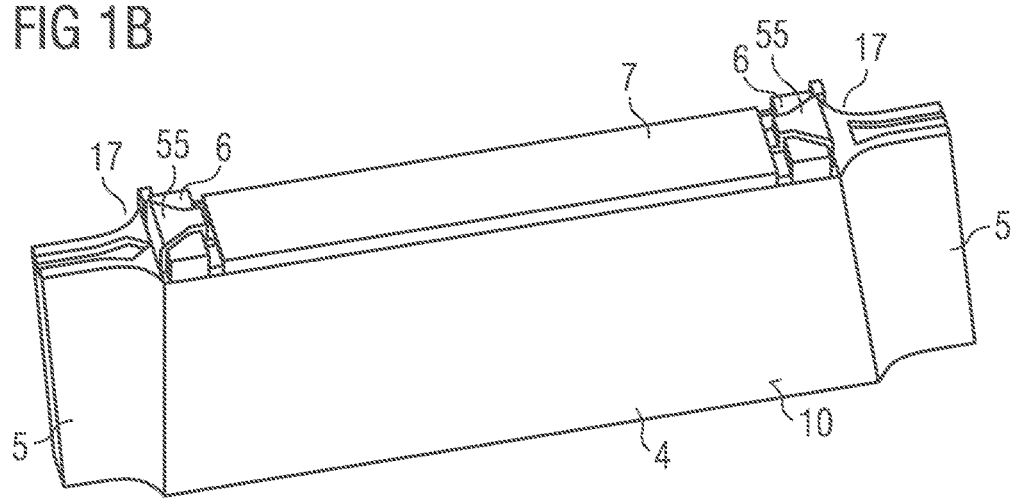

An exemplary embodiment of an optoelectronic semiconductor component is shown in FIG. 1B in a perspective illustration and in FIG. 1A in an associated sectional view.

The optoelectronic semiconductor component 1 comprises a semiconductor chip 2 having a semiconductor layer sequence 200, wherein the semiconductor layer sequence 200 comprises an active region 20 intended for generating radiation. The semiconductor layer sequence 200 is arranged on a carrier 29 of the semiconductor chip. In a vertical direction, i.e., perpendicular to a main extension plane of the active region 20, the semiconductor chip extends between a front side 201 and a rear side 202 opposite the front side. The front side 201 forms a radiation exit surface of the semiconductor chip. Furthermore, the semiconductor chip 1 has side surfaces 205, which connect the front side 201 to the rear side 202. The semiconductor chip 2 furthermore comprises two electrical connection surfaces 25, which are each arranged on the front side of the semiconductor chip 2.

Two exemplary embodiments of semiconductor chips 2 having two front connection surfaces 25 for electrical contacting are described in more detail in conjunction with FIGS. 1C and 1D.

The optoelectronic semiconductor component 1 furthermore comprises a molded body 4, which is molded on to the semiconductor chip 2 in some areas. In the exemplary embodiment shown, the molded body covers all the side surfaces 205 of the semiconductor chip and in some places the rear side 202. In a vertical direction, the molded body 4 has a greater extension than the semiconductor chip 2. In some areas in each case, the molded body 4 forms a rear side 12 and a front side 11 of the semiconductor component 1 as well as the side surfaces 15 of the semiconductor component. On the rear side 12, the molded body 4 has a recess 41.

In the recess 41, a thermal connector 3 is formed, which extends from the rear side 12 of the semiconductor component 1 to the rear side 202 of the semiconductor chip 2. The thermal connector directly borders the semiconductor chip. In particular, no interconnecting layer, such as a solder layer or an adhesive layer, is necessary between the thermal connector and the semiconductor chip. The molded body can also have multiple such recesses. A cross-sectional area of the recess or recesses in a top view of the front side of the semiconductor chip 2 is sufficiently large that the heat can be dissipated efficiently via the thermal connector during operation of the semiconductor chip. On the rear side 12 of the semiconductor component, the thermal connector forms a connection surface, which preferably amounts to at least 60%, particularly preferably at least 100%, of the surface area of the rear side of the semiconductor chip 2. In a lateral direction, the thermal connector 3 is preferably surrounded completely by the molded body 4. The thermal connector therefore does not extend to the side surfaces 15 of the semiconductor component 1.

The molded body 4 contains, e.g., a plastic, such as an epoxy or a silicone. Waste heat generated in the semiconductor chip during operation of the semiconductor component can be dissipated efficiently from the semiconductor chip 2 via the thermal connector 3. In particular, the heat transfer does not have to take place via the molded body 4.

The connection surfaces 25 of the semiconductor chip are each connected to contact surfaces 5 of the semiconductor component via contact paths 55. The contact surfaces 5 are provided for the external electrical contacting of the semiconductor component. By applying an electrical voltage between the contact surfaces 5, charge carriers from opposite sides can be injected into the active region 20 of the semiconductor chip 2 and can recombine there with the emission of radiation.

The thermal connector 3 is therefore provided in addition to the two front connection surfaces and in particular is not necessary for electrical contacting.

To simplify contacting of the thermal connectors 3 and the contact surfaces 5, the thermal connector and the contact surfaces can comprise a solderable material 35, such as gold or tin. For example, the solderable material is a coating, which forms an outer surface of the thermal connector 3 or the contact surfaces 5.

On the front side 201 of the semiconductor chip in the exemplary embodiment shown, a radiation conversion element 7 is arranged. The radiation conversion element 7 is provided for converting at least some of the primary radiation generated in the active region to secondary radiation. For example, the semiconductor component 1 can emit mixed radiation with the primary radiation and the secondary radiation, the mixed radiation supplying, e.g., a white color impression to the human eye. However, it is also possible to omit such a radiation conversion element.

In a top view of the front side of the semiconductor component 1, the semiconductor component has a rectangular basic shape with indentations 17 at the corners of the semiconductor component. The contact surfaces 5 are formed on the side surfaces of the indentations 17.

The optoelectronic semiconductor component 1 is in the form of a so-called sidelooker, in which a side surface 15 forms a mounting surface 10 of the semiconductor component.

FIG. 1E shows an exemplary embodiment of a device in which a semiconductor component 1 of this type is arranged on a connection carrier 8. The connection carrier has two electrical connection support surfaces 81, which are in each case electrically-conductively connected to the contact surfaces 5 of the semiconductor component 1 via a connecting means 85. During electrical contacting, the connecting means 85 can at least partly fill the indentations 17 of the semiconductor component.

Furthermore, the connection carrier 8 comprises a thermal connection carrier surface 82, which is connected to the thermal connector 3 of the optoelectronic semiconductor component 1. This connection does not necessarily have to be electrically conductive. Preferably, this thermal connection takes place using the same connecting means 85 as the electrical connection between the electrical connection support surfaces 81 and the contact surfaces 5, so that the thermal connection and the electrical connections can be formed in a joint production step. Preferably, the connecting means 85 contains a solder. A connection having high electrical and, at the same time, high thermal conductivity can thus be achieved more easily. Alternatively, however, it is also conceivable to produce the connection by means of an, in particular electrically conductive, adhesive.

As the connection carrier 8, e.g., a printed circuit board, such as an FR4 printed circuit board, a flexible printed circuit board or a metal core printed circuit board, is suitable.

The contact paths 55 are each guided over an interface 42 between the semiconductor chip 2 and the molded body 4. At the level of the interface, the contact paths 55 are each at a distance from the interface 42 in a vertical direction. For example, between the contact paths 55 and the interface 42 an electrically insulating material 6 is arranged, for example, a polymer material such as a silicone or an epoxy. Alternatively, instead of an electrically insulating material, an air gap can also be provided. An extension of the dielectric material in a vertical direction is, e.g., between 35 μm and 350 μm inclusive, preferably between 50 μm and 100 μm inclusive.

Because the contact path 55 is configured at a distance from the interface 42, an electrical short circuit of the semiconductor chip at the edge of the semiconductor chip can be avoided simply and reliably.

In FIG. 1C, an exemplary embodiment of a semiconductor chip 2 is shown, which is particularly suitable for the exemplary embodiment of the optoelectronic semiconductor component 1 shown in FIGS. 1A and 1B. The semiconductor layer sequence 200 has an active region 20 provided for generating radiation, which is arranged between a first semiconductor layer 21 and a second semiconductor layer 22. The semiconductor layer sequence 200 is connected by means of an interconnecting layer 24, e.g., a solder layer or an adhesive layer, to a carrier 29 of the semiconductor chip. The carrier 29 serves to stabilize the semiconductor layer sequence 200 mechanically, so that a growth substrate for the semiconductor layer sequence is no longer necessary for this purpose and can be removed during the production of the semiconductor chip.

The first semiconductor layer 21 is electrically-conductively connected to a connection surface 25 via a first connection layer 27. The first connection layer 27 can furthermore fulfil the function of a mirror layer for the radiation generated in the active region 20. The semiconductor layer sequence 200 furthermore comprises recesses 26, which extend through the first semiconductor layer 21 and the active region 20 into the second semiconductor layer 22. In the recesses 26, the second semiconductor layer 22 is electrically-conductively connected to a second connection layer 28. Via this second connection layer 28, the second semiconductor layer is electrically-conductively connected to the connection surface 25. To avoid an electrical short circuit between the first connection layer and the second connection layer as well as between the second connection layer and the first semiconductor layer 21, an insulation layer 23 is provided.

The connection surfaces 25 are each arranged at the side of the semiconductor layer sequence 200, such that the front side of the semiconductor layer sequence facing away from the carrier 29 is free from metallic material. The risk of shading the radiation generated in the active region can thus be avoided.

Furthermore, the carrier 29 can be selected in view of high thermal conductivity. For example, the carrier 29 can contain a semiconductor material, such as silicon or germanium, or can consist of such a material. These materials are distinguished by high thermal conductivity, in particular compared with a sapphire growth substrate.

Alternatively, however, another semiconductor chip having two front contacts can also be used, e.g., a semiconductor chip in the form illustrated in FIG. 1D. In this semiconductor chip, the growth substrate itself forms the carrier 29. No interconnecting layer is therefore necessary between the semiconductor layer sequence 200 and the carrier 29. The connection surfaces 25 are each arranged on the semiconductor layer sequence 200. A semiconductor chip of this type can be produced particularly simply and cost-effectively.

In FIG. 2, a further exemplary embodiment of a semiconductor component 1 is shown. This further exemplary embodiment substantially corresponds to the exemplary embodiment described in conjunction with FIGS. 1A to 1E. In contrast thereto, the semiconductor component 1 is designed as a so-called toplooker, in which a rear side 12 of the semiconductor component 1 forms a mounting surface 10 of the semiconductor component. In case of mounting on a connection carrier, the main radiation direction of the radiation generated in the active region 20 of the semiconductor chip 2 runs perpendicularly to the connection carrier.

The molded body 4 furthermore comprises multiple recesses 41, in which the thermal connector 3 borders the rear side 202 of the semiconductor chip 2. In a semiconductor chip 2 having a connection surface on the rear side 202, the thermal connector 3 in this exemplary embodiment can also form an electrical contact surface 5 of the semiconductor component 1. In this case, only one connection surface is necessary on the front side 201 of the semiconductor chip 2. The front connection surface 25 in turn is connected via a contact path 55 to a contact surface 5, the electrically-conductive connection taking place through an opening 45 through the molded body 4. Alternatively, as described in conjunction with FIGS. 1A to 1E, the semiconductor chip can also comprise two front connection surfaces 25, so that the thermal connector 3 is used exclusively to dissipate heat from the semiconductor chip 2 and not for the electrical contacting of the semiconductor chip 2.

In the toplooker shown in FIG. 2, the vertical extension of the molded body 4 and thus the mechanical stability of the semiconductor component 1 can be increased without a deterioration in heat dissipation from the semiconductor chip 2, since the heat can be dissipated from the semiconductor component 1 via the thermal connector 3 and therefore heat dissipation does not have to take place via the material of the molded body 4. In particular, the vertical extension of the molded body can be increased without the vertical extension of the semiconductor chip likewise having to be increased.

With the aid of FIGS. 3A to 3I, an exemplary embodiment of a method for producing optoelectronic semiconductor components 1 is described. The description is based on a detail from which two semiconductor components 1 are obtained during production which, by way of example, are formed as described in conjunction with FIGS. 1A to 1E.

Firstly, semiconductor chips 2 are provided and overmolded with a molding compound 4, wherein the molding compound borders the side surfaces 205 and the rear sides 202 of the semiconductor chips in some places. The front sides 201 of the semiconductor chips remain preferably completely or at least partly free from material of the molded body composite 40.

Figure 3A:
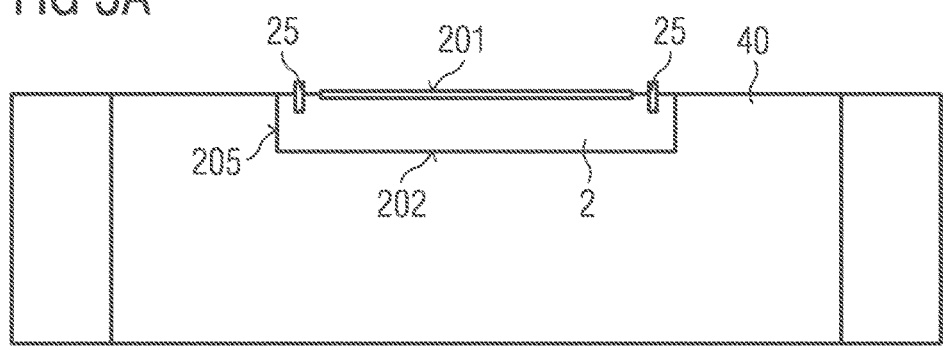
FIGS. 3A to 3I are exemplary embodiments of a method for producing optoelectronic semiconductor components with the aid of intermediate steps, which are illustrated in schematic sectional view (FIGS. 3A, 3C, 3E and 3G) and in top view (FIGS. 3B, 3D, 3F, 3H and 3I).
Figure 3B:
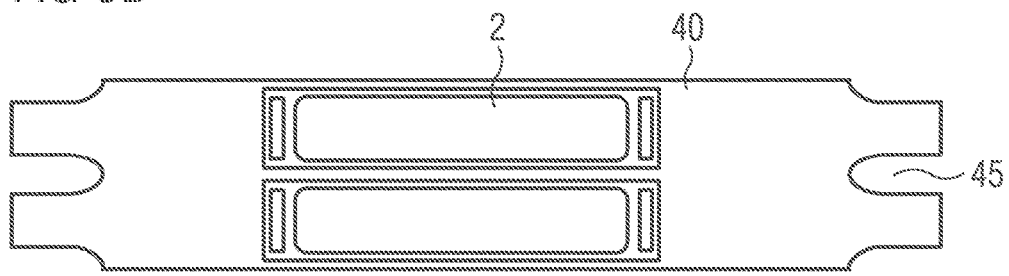
Figure 3C:
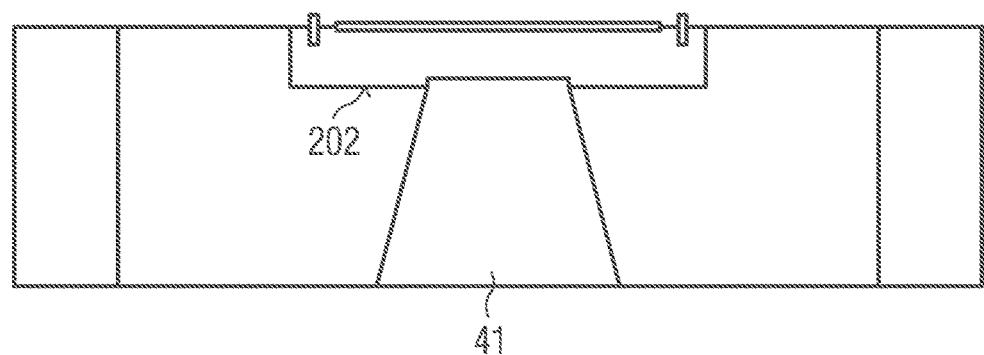
Figure 3D:

The molded body composite 40, as shown in FIGS. 3A and 3B, has cut-outs 45 which extend in a vertical direction through the molded body composite. These cut-outs can already have originated during the formation of the molded body composite, e.g., by means of an appropriately shaped mold, or can be formed subsequently by removal of material from the molded body composite, e.g., by means of mechanical material removal, for instance by drilling, or by material removal using coherent radiation such as laser radiation.

Subsequently, the rear side 202 of the semiconductor chip 2 is exposed in some regions. To this end, recesses 41 are formed in the molded body composite 40. The recesses can be formed by material removal as already described in conjunction with the cut-outs. Alternatively, the molded body composite can also be formed in such a way that the semiconductor chips are already exposed in some places. When the recesses 41 are formed in the molded body composite 40, it is also possible for material of the semiconductor chip 2 to be removed in some places. In this way, it is easy to ensure that no material of the molded body composite is present between the subsequently produced thermal connector and the semiconductor chip 2. However, the material removal can also stop directly at the semiconductor chip when forming the recesses.

Figure 3E:
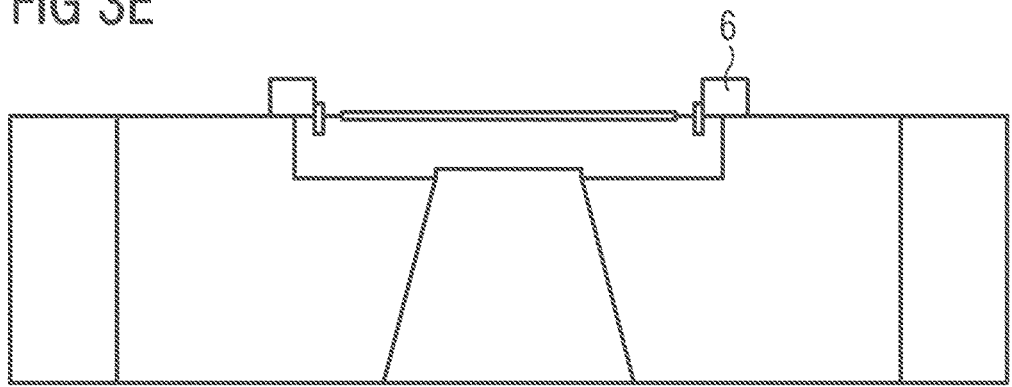
Figure 3F:
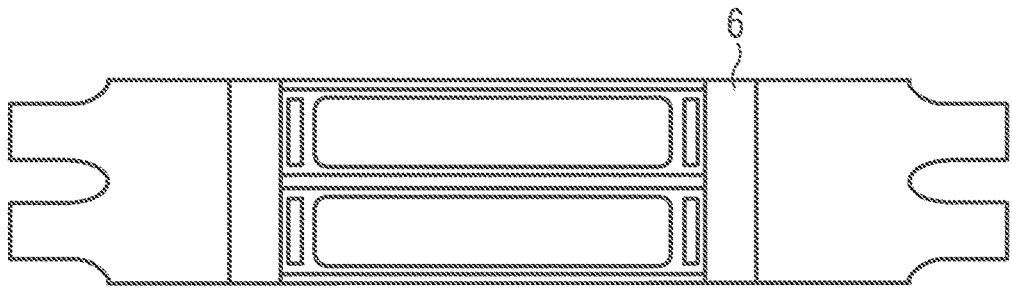

On an interface 42 between the semiconductor chips 2 and the molded body composite 40, an electrically insulating material 6 is applied at least in some places (FIGS. 3E and 3F). The insulating material therefore borders the semiconductor chips in some places and the molded body composite in some places. For example, the electrically insulating material can be formed in the shape of continuous strips across multiple semiconductor chips. The electrically insulating material is applied at least at the points where contact paths for contacting the semiconductor chips are subsequently formed. However, an electrically insulating material of this type is not absolutely necessary.

Figure 3G:
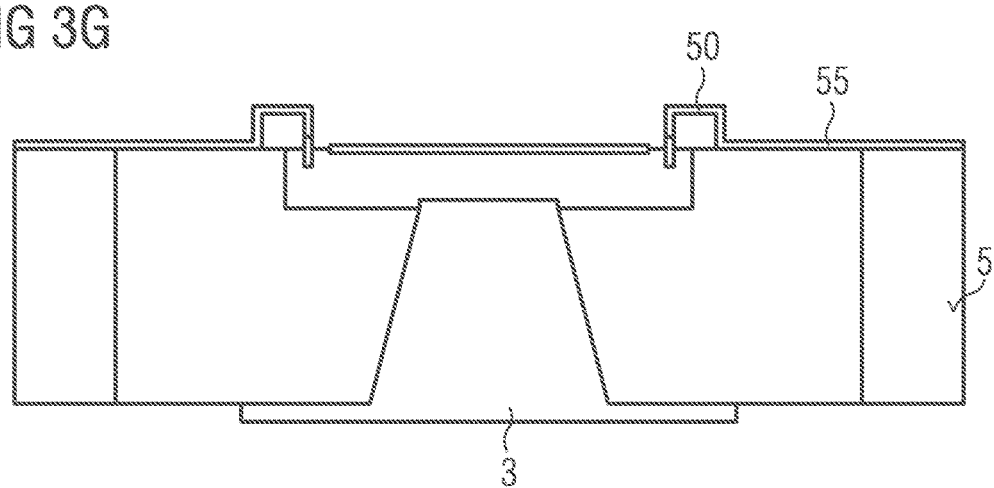
Figure 3H:
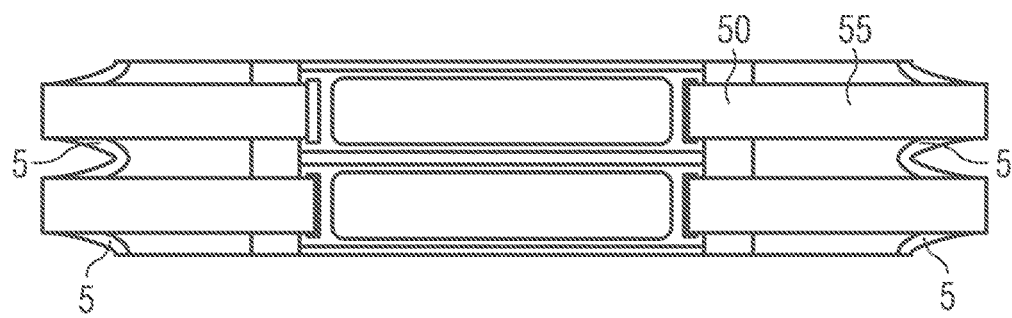

Subsequently, as illustrated in FIGS. 3G and 3H, a coating 50 is applied with which contact paths 55 and contact surfaces 5 for the electrical contacting of the semiconductor chip 2 are formed. The contact paths are in particular guided over the electrically insulating material 6. The contact surfaces 5 are formed on the side surfaces of the cut-outs 45 of the molded body composite.

Furthermore, in the recesses 41 for each semiconductor chip at least one thermal connector 3 is formed. The thermal connector is not, therefore, part of a prefabricated carrier but is applied on to the already overmolded semiconductor chips, e.g., by means of a deposition method. To this end, the recesses can be partly or completely filled. The filling can take place in multiple steps, e.g., by means of a seeding layer, which is subsequently reinforced. The seeding layer can be applied, e.g., by means of sputtering, thermal evaporation or by means of palladium seeding. The reinforcement can take place, e.g., in an electroplating process. The lateral patterning of the thermal connector 3 on the rear side of the semiconductor components can take place, e.g., by means of a lithographic method.

The production of the thermal connector 3 and the coating 50 for the electrical contacting can be carried out in a joint production step or in at least one joint sub-step, so that the thermal connector 3 can be produced with low additional process effort.

For the purpose of simplifying contacting of the thermal connectors 3 and the contact surfaces 5, finally, a solderable material 35 can be applied (see FIG. 1A), which forms an outer surface of the thermal connector 3 and the contact surfaces 5, respectively.

Figure 3I:
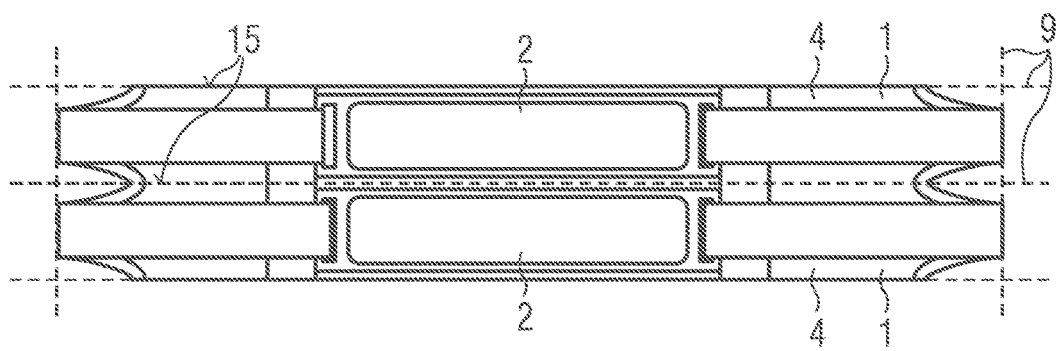

Finally, the molded body composite 40 is singulated along singulation lines 9, illustrated in FIG. 3I, for the purpose of singulating the semiconductor components 1. This can take place, e.g., by means of a mechanical method, such as sawing, or by means of coherent radiation. The singulation lines 9 run through the cut-outs 45 of the molded body composite, such that indentations 17 are formed from the cut-outs in the corners of each resulting molded body 4. In these indentations the contact surfaces 5 for the electrical contacting of the semiconductor component 1 are available. The side surfaces 15 of the semiconductor component are formed when the molded body composite 40 is singulated into individual molded bodies 4. The side surfaces can therefore exhibit traces typical of the singulation method, e.g., sawing traces or traces of material removal by means of laser radiation. One of the side surfaces 15 of the semiconductor component formed during singulation forms a mounting surface 10.

The method described is naturally also suitable for the production of toplookers, e.g., toplookers that are described in conjunction with FIG. 2. In this case, it is not the side surfaces 15 of the molded body 4 obtained during singulation that form the mounting surface 10, but the rear side 12 of the semiconductor component facing away from the front side of the semiconductor chip.

If the thermal connector 3 additionally acts as an electrical contact surface, seed layers suitable for the production of the thermal connector 3 are expediently used, with which a low electrical resistance to the semiconductor chip 2 may be achievable.

The method described allows the production, in a simple and reliable manner, of a semiconductor component in which the heat loss occurring during operation of the semiconductor component can be dissipated efficiently via the thermal connector 3 despite the embedding of the semiconductor chip in a molded body 4. As a result, both the efficiency of the semiconductor chip and its service life are increased owing to the reduced temperatures occurring during operation of the semiconductor component. Furthermore, the mechanical anchoring on a connection carrier can be improved by means of the additional thermal connector, in particular by an additional soldered joint. Furthermore, the semiconductor components can be produced in a particularly compact and cost-effective manner, compared in particular with semiconductor components in which the semiconductor chips are placed into prefabricated housing bodies.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The invention claimed is:

1. An optoelectronic semiconductor component comprising:
    a semiconductor chip comprising:
        a front side;
        a rear side;
        at least two side surfaces;
        a semiconductor layer sequence having an active region configured to generate radiation; and
        an electrical connection surface located on the front side of the semiconductor chip;
    a molded body molded to the semiconductor chip at least in some places, wherein the molded body borders the at least two side surfaces of the semiconductor chip;
    a thermal connector located at a rear side of the semiconductor component, wherein the rear side of the semiconductor component is opposite the front side of the semiconductor chip, the thermal connector extending to the rear side of the semiconductor chip; and
    electrical contact surfaces of the semiconductor component being accessible on an outer surface of the semiconductor component, wherein the electrical connection surface is electrically-conductively connected to an electrical contact surface via a contact path running on the molded body, wherein, in a top view of a front side of the semiconductor component, the semiconductor component has a rectangular basic shape with indentations at corners of the semiconductor component, wherein the electrical contact surfaces are located on side surfaces of the indentations, and wherein the front side of the semiconductor chip is free from a material of the molded body at least in some places.

2. The semiconductor component according to claim 1, wherein the molded body is molded on to the rear side of the semiconductor chip in some areas, and wherein the molded body comprises at least one recess, through which the thermal connector extends to the rear side of the semiconductor chip.

3. The semiconductor component according to claim 1, wherein a surface area of the thermal connector on the rear side of the semiconductor component amounts to at least 60% of the surface area of the rear side of the semiconductor chip.

4. The semiconductor component according to claim 1, wherein the semiconductor chip comprises two electrical connection surfaces on the front side, each electrical connection surface being connected to one of the electrical contact surfaces of the semiconductor component via one contact path.

5. The semiconductor component according to claim 4, wherein the thermal connector is located at a distance from the electrical contact surfaces of the semiconductor chip, and wherein, in the top view of the front side of the semiconductor chip, the thermal connector overlaps the semiconductor chip.

6. The semiconductor component according to claim 1, wherein an outer surface of the thermal connector comprises a solderable material.

7. The semiconductor component according to claim 1, wherein a contact path is guided over an interface between the molded body and the semiconductor chip, and wherein the contact path is at a distance from the interface in a direction running perpendicularly to the front side.

8. The semiconductor component according to claim 7, further comprising an electrically insulating material arranged between the interface and the contact path.

9. The semiconductor component according to claim 1, wherein a side surface of the semiconductor component, running obliquely or perpendicularly to the active region, forms a mounting surface, and wherein the contact path is a planar electrical contact path without a bond wire connection.

10. The semiconductor component according to claim 1, wherein the rear side of the semiconductor component forms a mounting surface of the semiconductor component, and wherein the semiconductor component is electrically contactable on the rear side.

11. A method for producing a plurality of semiconductor components, the method comprising:
    providing a plurality of semiconductor chips, each semiconductor chip comprising a front side, a rear side opposite the front side and an active region for generating radiation;
    overmolding the semiconductor chips with a molding compound in some regions to form a molded body composite, wherein the molding compound covers the rear sides;
    exposing the rear sides of the semiconductor chips in some regions;
    forming a plurality of thermal connectors bordering the rear sides of the semiconductor chips;
    forming cut-outs in the molded body composite; and
    singulating the molded body composite into a plurality of semiconductor components such that each semiconductor component comprises a semiconductor chip, a molded body and a thermal connector, wherein the molded body borders at least two side surfaces of the semiconductor chip, wherein the front side of the semiconductor chip is free from a material of the molded body at least in some places, and such that singulation lines run through the cut-outs so that, in corners of each resulting molded body, indentations are formed from the cut-outs, and wherein contact surfaces for electrical contacting of the semiconductor component are formed on side surfaces of the indentations.

12. The method according to claim 11, further comprising, before singulating the molded body composite, applying a coating on the molded body composite, wherein the coating is for electrical contacting of the semiconductor chips.

13. The method according to claim 12, wherein the side surfaces of the cut-outs are coated with the coating.

14. An optoelectronic semiconductor component comprising:
    a semiconductor chip comprising:
        a front side;
        a rear side;
        a semiconductor layer sequence having an active region configured to generate radiation; and
        an electrical connection surface located on the front side of the semiconductor chip;
    a molded body arranged at the semiconductor chip at least in some places;
    electrical contact surfaces accessible on an outer surface of the semiconductor component; and
    a thermal connector located on a rear side of the semiconductor component, wherein the rear side of the semiconductor component is opposite the front side of the semiconductor chip, the thermal connector extending to the rear side of the semiconductor chip,
    wherein the electrical connection surface is conductively connected to an electrical contact surface via a contact path running on the molded body,
    wherein the molded body is molded to the rear side of the semiconductor chip in some areas,
    wherein the molded body comprises at least one recess through which the thermal connector extends to the rear side of the semiconductor chip,
    wherein, in a top view of a front side of the semiconductor component, the semiconductor component has a rectangular basic shape with indentations at corners of the semiconductor component,
    wherein the electrical contact surfaces are located on side surfaces of the indentations, and
    wherein the contact path is guided over an interface between the molded body and the semiconductor chip and the contact path is at a distance from the interface in a direction perpendicularly to the front side.

* * * * *